United States Patent
Rong et al.

(10) Patent No.: US 9,159,876 B2
(45) Date of Patent: Oct. 13, 2015

(54) SURFACE TREATMENT OF A SEMICONDUCTOR LIGHT EMITTING DEVICE

(71) Applicant: KONINKLIJKE PHILIPS N.V., Eindhoven (NL)

(72) Inventors: Yiwen Rong, San Maeo, CA (US); James Gordon Neff, Felton, CA (US); Tak Seng Thang, Bukit Mertajam (MY)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 14/347,252

(22) PCT Filed: Oct. 1, 2012

(86) PCT No.: PCT/IB2012/055243
§ 371 (c)(1),
(2) Date: Mar. 26, 2014

(87) PCT Pub. No.: WO2013/050917
PCT Pub. Date: Apr. 11, 2013

(65) Prior Publication Data
US 2014/0235002 A1      Aug. 21, 2014

Related U.S. Application Data

(60) Provisional application No. 61/543,851, filed on Oct. 6, 2011.

(51) Int. Cl.
*H01L 33/00*       (2010.01)
*H01L 33/22*       (2010.01)

(52) U.S. Cl.
CPC ............. *H01L 33/22* (2013.01); *H01L 33/0079* (2013.01)

(58) Field of Classification Search
CPC .................................................. H01J 37/32935
USPC .......................... 438/9, FOR. 157, FOR. 287
See application file for complete search history.

(56) References Cited

U.S. PATENT DOCUMENTS

| 5,779,924 | A * | 7/1998 | Krames et al. .................. 216/24 |
| 7,256,483 | B2 |  8/2007 | Epler et al. |

(Continued)

FOREIGN PATENT DOCUMENTS

EP        0921568 A2     6/1999

OTHER PUBLICATIONS

"Studies of Improving Light Extraction Efficiency of High Power Blue Light Emitting Diode by Photo-Enhanced Chemical Etching" Fang et al, Journal of Crystal Growth, Amsterdam, NL, vol. 298, Feb. 13, 2007, p. 703-705.

"Synergy Effect of Particle Radiation and Ultraviolet Radiation from Capacitively Coupled Radio Frequency Argon Plasmas on n-GaN Etching Damage" Kawakami et al, Japanese Journal of Applied Physics, vol. 47, No. 8, Aug. 2008, p. 6863-6866.

"Defect Depth Profiling Using Photoluminescence and Cathodoluminescence Spectroscopy:The Role of Oxygen on Reactive Ion Beam Etching of GaN in O2/Ar Plasmas" Hsieh et al, Applied Surface Science vol. 175-176 May 15, 2001.

(Continued)

*Primary Examiner* — Julio J Maldonado
*Assistant Examiner* — Robert Bates

(57) ABSTRACT

A method according to embodiments of the invention includes roughening (FIG. 6) a surface (58) of a semiconductor structure (46-48, FIG. 5). The semiconductor structure includes a light emitting layer (47). The surface (58) is a surface from which light is extracted from the semiconductor structure. After roughening, the roughened surface is treated (FIG. 7) to increase total internal reflection, or absorption at the surface, or to reduce an amount of light extracted from the semiconductor structure through the surface (58).

19 Claims, 3 Drawing Sheets

(56) References Cited

U.S. PATENT DOCUMENTS

| | | | |
|---|---|---|---|
| 7,932,111 B2 | 4/2011 | Edmond | |
| 7,985,979 B2 | 7/2011 | David et al. | |
| 8,617,909 B2* | 12/2013 | Batres et al. | 438/22 |
| 8,883,529 B2* | 11/2014 | Wakai et al. | 438/29 |
| 8,987,711 B2* | 3/2015 | Hiyama et al. | 257/40 |
| 2006/0202219 A1* | 9/2006 | Ohashi et al. | 257/98 |
| 2009/0146170 A1* | 6/2009 | Zhong et al. | 257/98 |
| 2010/0019260 A1* | 1/2010 | Epler et al. | 257/98 |
| 2010/0041170 A1* | 2/2010 | Epler et al. | 438/26 |
| 2010/0052000 A1* | 3/2010 | Ko et al. | 257/98 |
| 2010/0248407 A1* | 9/2010 | Umemura et al. | 438/45 |
| 2011/0114970 A1 | 5/2011 | Teng et al. | |
| 2011/0151610 A1* | 6/2011 | Ramappa et al. | 438/57 |

OTHER PUBLICATIONS

"Increase in the Extraction Efficiency of GaN Based Light Emitting Diodes via Surface Roughening" Fujii et al, , Applied Physics Letters, AIP vol. 84, No. 6, Feb. 9, 2004, p. 855-857.

"Effects of Capacitively Coupled Radio Frequency Krypton and Argon Plasmas on Gallium Nitride Etching Damage" Kawakami et al, Japanese Journal of Applied Physics, vol. 48, No. 8, pt. 2 Aug. 1, 2009 p. 8HF01-1-4.

"Analysis of GaN Etching Damage by Capacitively Coupled RF Ar Plasma Exposure" Thin Solid Films, vol. 516, No. 11, Mar. 13, 2008, p. 3478-3481.

* cited by examiner

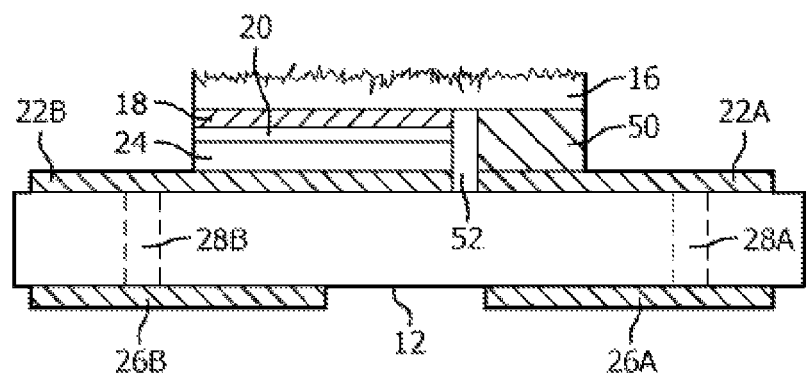
FIG. 1 [PRIOR ART]
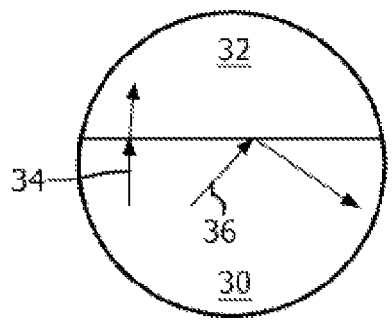
FIG. 2
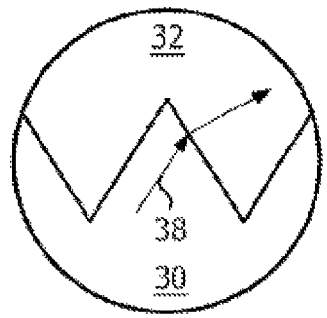
FIG. 3
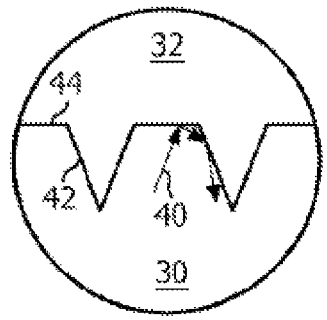
FIG. 4

SURFACE TREATMENT OF A SEMICONDUCTOR LIGHT EMITTING DEVICE

CROSS-REFERENCE TO PRIOR APPLICATIONS

This application is the U.S. National Phase application under 35 U.S.C. §371 of International Application No. PCT/IB2012/055243, filed on Oct. 1, 2012, which claims the benefit of U.S. application No. 61/543,851 filed on Oct. 6, 2011. These applications are hereby incorporated by reference.

BACKGROUND

1. Field of Invention

The present invention relates to controlling the amount of flux emitted by a semiconductor light emitting device by treating a surface of the device.

2. Description of Related Art

Semiconductor light-emitting devices including light emitting diodes (LEDs), resonant cavity light emitting diodes (RCLEDs), vertical cavity laser diodes such as surface-emitting lasers (VCSELs), and edge emitting lasers are among the most efficient light sources currently available. Materials systems currently of interest in the manufacture of high-brightness light emitting devices capable of operation across the visible spectrum include Group III-V semiconductors, particularly binary, ternary, and quaternary alloys of gallium, aluminum, indium, and nitrogen, also referred to as III-nitride materials. Typically, III-nitride light emitting devices are fabricated by epitaxially growing a stack of semiconductor layers of different compositions and dopant concentrations on a sapphire, silicon carbide, III-nitride, or other suitable substrate by metal-organic chemical vapor deposition (MOCVD), molecular beam epitaxy (MBE), or other epitaxial techniques. The stack often includes one or more n-type layers doped with, for example, Si, formed over the substrate, one or more light emitting layers in an active region formed over the n-type layer or layers, and one or more p-type layers doped with, for example, Mg, formed over the active region. Electrical contacts are formed on the n- and p-type regions.

FIG. 1 illustrates a light emitting device described in more detail in U.S. Pat. No. 7,256,483. To form the device of FIG. 1, a conventional LED is formed on a growth substrate. Each LED die includes n-type layers 16, an active layer 18, and p-type layers 20. A metal (metallization layer plus bonding metal) 24 contacts the p-layer. Portions of the p-layer 20, active layer 18, and possibly metal 24 are etched away during the LED forming process, and metal 50 contacts the p-layer 16 on the same side as the p-contact metal 24. An underfill material 52 may be deposited in the voids beneath the LED to reduce thermal gradients across the LED, add mechanical strength to the attachment, and prevent contaminants from contacting the LED material. The metallization layers 50 and 24 are bonded to metal contact pads 22A and 22B, respectively, on a package substrate 12. The package substrate 12 may be formed of the electrically insulating material AlN, with metal contact pads 22A and 22B connected to solderable electrodes 26A and 26B using vias 28A and 28B and/or metal traces. The growth substrate is removed, then the light-emitting top surface of the LED (n-layer 16) is roughened for increased light extraction. For example, layer 16 may be photo-electrochemically etched using a KOH solution 46.

SUMMARY

It is an object of the invention to provide a light emitting device where the maximum amount of flux from the device may be controlled.

A method according to embodiments of the invention includes roughening a surface of a semiconductor structure. The semiconductor structure includes a light emitting layer. The roughened surface is a surface from which light is extracted from the semiconductor structure. In some embodiments, after roughening, the surface is treated to increase total internal reflection or absorption at the surface. In some embodiments, after roughening, the surface is treated to reduce an amount of light extracted from the semiconductor structure through the surface.

BRIEF DESCRIPTION OF THE DRAWINGS

FIG. 1 illustrates an LED from which the growth substrate has been removed.

FIG. 2 illustrates the behavior of light at an interface between air and III-nitride material.

FIG. 3 illustrates the behavior of light at an interface between air and roughened III-nitride material.

FIG. 4 illustrates the behavior of light at an interface between air and III-nitride material treated according to embodiments of the invention.

DETAILED DESCRIPTION

Figure 5:
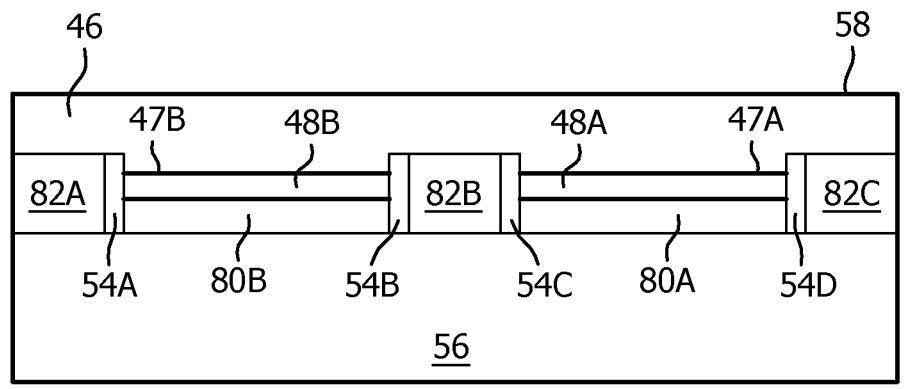
FIG. 5 is a cross sectional view of a device according to embodiments of the invention.

The difference in index of refraction between III-nitride material and air creates total internal reflection at a smooth interface, as illustrated in FIG. 2. At a smooth interface between III-nitride material 30, which has an index of refraction of about 2.4, and air 32, which has an index of refraction of about 1, light 34 emitted at small angles relative to the growth direction escape the III-nitride material. Light 36 emitted at glancing angles is totally internally reflected at the interface and may be lost to absorption within the device.

In order to improve extraction from the device, the top surface of the III-nitride material may be roughened as described above in reference to FIG. 1. The behavior of light 38 emitted at a glancing angle toward a roughened interface is illustrated in FIG. 3. Because of the rough surface of III-nitride material 30, light emitted at a glancing angle relative to the growth direction encounters the surface of the III-nitride material 30 at an angle that allows it to escape into air 32.

However, roughening of the III-nitride surface by photo-electrochemical (PEC) etching is difficult to control. For most practical purposes, extraction of light can only be maximized with PEC etching, as the amount of extraction is difficult to adjust. Some applications, such as for example automotive applications, require a particular maximum flux that may not be exceeded. Modern, high-power LEDs with roughened top surfaces as described above may be too bright for these applications.

In accordance with embodiments of the invention, the roughened surface of a semiconductor light emitting device is treated to reduce the amount of flux extracted from the LED. The treatment may create a surface that reintroduces some total internal reflection at the interface or that causes absorption, as illustrated in FIG. 4. Roughening forms peaks as illustrated in FIG. 3. Post-roughening treatment according to embodiments of the invention may flatten the tops of those peaks 44, as illustrated in FIG. 4. Glancing angle light striking the steep sides 42 of the peaks may be extracted from the III-nitride material 30 into the air 32. Glancing angle light 40 striking the flattened tops 44 may undergo total internal reflection, as illustrated. Internally reflected light may be absorbed.

FIG. 5 illustrates a semiconductor light emitting device according to embodiments of the invention. Though in the discussion below the semiconductor light emitting device is a III-nitride LED that emits blue or UV light, semiconductor light emitting devices besides LEDs such as laser diodes and semiconductor light emitting devices made from other materials systems such as other III-V materials, III-phosphide, III-arsenide, II-VI materials, ZnO, or Si-based materials may be used.

The device illustrated in FIG. 5 may be formed by first growing a semiconductor structure on a growth substrate (not shown in FIG. 5), as is known in the art. The growth substrate may be any suitable substrate such as, for example, sapphire, SiC, Si, GaN, or composite substrates. The semiconductor structure includes a light emitting or active region 47A, 47B sandwiched between n- and p-type regions 46 and 48A, 48B. An n-type region 46 may be grown first and may include multiple layers of different compositions and dopant concentration including, for example, preparation layers such as buffer layers or nucleation layers, and/or layers designed to facilitate removal of the growth substrate, which may be n-type or not intentionally doped, and n- or even p-type device layers designed for particular optical, material, or electrical properties desirable for the light emitting region to efficiently emit light. A light emitting or active region 47 is grown over the n-type region 46. Examples of suitable light emitting regions include a single thick or thin light emitting layer, or a multiple quantum well light emitting region including multiple thin or thick light emitting layers separated by barrier layers. A p-type region 48A, 48B may then be grown over the light emitting region 47. Like the n-type region 46, the p-type region 48A, 48B may include multiple layers of different composition, thickness, and dopant concentration, including layers that are not intentionally doped, or n-type layers. The total thickness of all the semiconductor material in the device is less than 10 µm in some embodiments and less than 6 µm in some embodiments.

A reflective metal p-contact 80A, 80B is formed on the p-type region 48A, 48B. The semiconductor structure is then patterned by standard photolithographic operations and etched to remove a portion of the entire thickness of the p-type region and a portion of the entire thickness of the light emitting region, to form at least one mesa which reveals a surface of the n-type region on which a metal n-contact 82A is formed. The n-contacts may be distributed, as illustrated by the three n-contacts 82A-82C illustrated in FIG. 5, or a single n-contact may be formed. The n- and p-contacts 82 and 80 may be electrically isolated by a gap 54A-54D, which may be filled with air, ambient gas, or a solid material such as a dielectric or an oxide of silicon. The mesa and p- and n-contacts may be formed in any suitable manner. Forming the mesa and p- and n-contacts is well known to a person of skill in the art. In the regions between devices on a wafer of devices, the semiconductor structure is etched down to an insulating layer, which may be an insulating semiconductor layer that is part of the semiconductor structure, or the growth substrate. The p- and n-contacts may be redistributed by a stack of insulating layers and metals as is known in the art to form at least two large electrical pads. One of the electrical pads is electrically connected to the p-type region of the semiconductor structure and the other of the electrical pads is electrically connected to the n-type region of the semiconductor structure. Electrical pads may be any suitable conductive material including, for example, copper, gold, and alloys. The electrical pads are electrically isolated from each other by a gap which may be filled with an insulating material such as a dielectric, air, or other ambient gas. The stack of layers used to redistribute the contacts and the electrical pads is well known in the art and is not illustrated in FIG. 5.

The semiconductor structure is attached to a mount 56 such that contacts 80A, 80B and 82A-82C are between the mount and the semiconductor structure. In some embodiments, a wafer of devices is diced into individual devices or groups of devices, then the diced devices or groups are attached to a mount, as described above in reference to FIG. 1. In these embodiments, the mount is often larger than the individual devices or groups of devices. In some embodiments, a wafer of devices is attached to a mount on a wafer scale, then after further processing, the wafer of devices and the mount are diced at the same time into individual devices or groups of devices. In these embodiments, the mount is the same size as the individual devices or groups of devices. Dicing can be performed by any suitable method such as scribe-and-break with a laser scribe or sawing and is well known in the art. The mount may be any suitable structure that mechanically supports the semiconductor structure, including, for example, a ceramic mount or wafer, a silicon mount or wafer, for example with conductive vias, or thick metal bonding pads which mechanically support the semiconductor structure, formed by, for example, plating. In some embodiments, mount 56 is a self-supporting structure suitable to attach the semiconductor light emitting device to a substrate such as a PC board. For example, the surface of mount 56 opposite the semiconductor structure (the bottom surface of mount 56 in FIG. 5) may be reflow-solderable.

Figure 6:
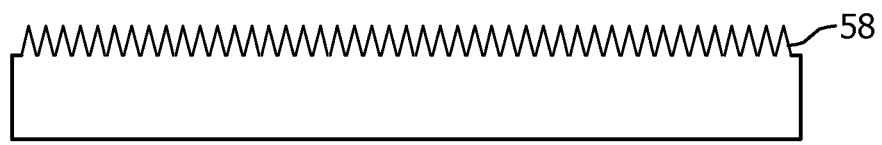
FIG. 6 illustrates a III-nitride surface after roughening.

The growth substrate is removed by any suitable technique. For example, the growth substrate may be removed by laser lift-off, etching, mechanical techniques such as grinding, or a combination of techniques. The surface 58 of the semiconductor structure exposed by removing the growth substrate, typically a surface of n-type region 46, may be optionally thinned and roughened, for example by PEC etching. FIG. 6 illustrates a surface 58 roughened by PEC etching.

Figure 7:
FIG. 7 illustrates a III-nitride surface after treatment according to embodiments of the invention.

The surface 58 of FIG. 6 is then treated to reduce extraction, as illustrated in FIG. 7. In some embodiments, surface 58 is treated with plasma, which may flatten the peaks formed by PEC etching, as illustrated in FIG. 7. Any suitable standard commercially-available plasma etching and/or cleaning system may be used. The plasma used may be any suitable plasma, including, for example, Ar, O, and mixtures. The spike-type features illustrated in FIG. 6 may be smoothed by plasma treatment in FIG. 7, which may lead to more total internal reflection at the interface, which may reduce extraction from the device. Plasma treatment may be either physical (i.e. sputter etching) or chemical (i.e. chemical etching) or a combination of physical and chemical etching.

Figure 8:
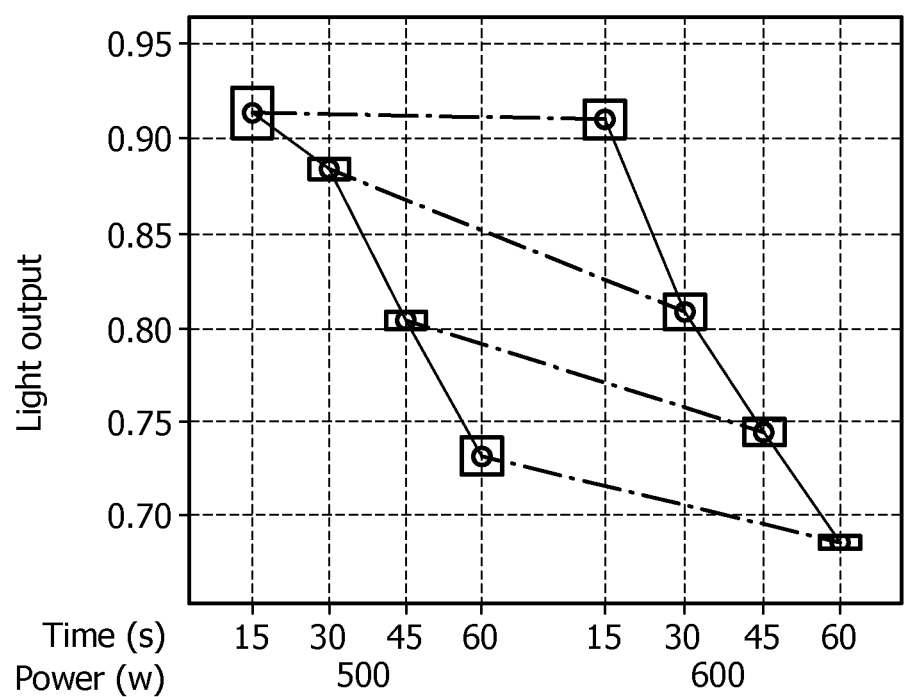
FIG. 8 illustrates light output as a function of treatment time for plasma treatment at low power and at higher power.

FIG. 8 illustrates light output as a function of plasma treatment time for a surface of a III-nitride device treated with plasma at 500 W and at 600 W. The four points on the left side of the figure illustrate light output for a surface treated with plasma at 500 W and the four points on the right side of the figure illustrate light output for a surface treated with plasma at 600 W. FIG. 8 illustrates that the light output or amount of extraction is roughly linearly proportional to the treatment time. The longer the surface is treated with plasma at either energy, the less light is extracted from the surface. In addition, the reduction in extraction is proportional to the power—treatment at higher power for a given time reduced extraction more than treatment at lower power for the same time. The inventors have observed that light output can be reduced by 30% of the maximum value (i.e. light output from a roughened surface without any treatment).

The following table compares a roughened surface with no post-roughening plasma treatment with a roughened surface treated for 60 s with plasma at 600 W. $R_a$ is the mean roughness of the surface and $R_{max}$ is the maximum height of surface features. Light output is given in arbitrary units.

| Surface | Light Output | $R_a$ (nm) | $R_{max}$ (nm) |
|---|---|---|---|
| No treatment | 420 | 185.8 | 1598 |
| 600 W treatment, 60 s | 287.28 | 133.4 | 1049 |

As illustrated in the above table, both light output and surface roughness are reduced for a treated surface. For example, as a result of treatment according to embodiments of the invention, the mean surface roughness may be reduced by at least 10% in some embodiments, by at least 20% in some embodiments, and by at least 30% in some embodiments. As a result of treatment according to embodiments of the invention, the maximum height of surface features may be reduced by at least 20% in some embodiments, by at least 30% in some embodiments, and by at least 40% in some embodiments.

After post-roughening treatment as described above, one or more optional structures such as filters, lenses, dichroic materials, or wavelength converting materials may be formed over the treated surface. A wavelength converting material may be formed such that all or only a portion of the light emitted by the light emitting device and incident on the wavelength converting material may be converted by the wavelength converting material. Unconverted light emitted by the light emitting device may be part of the final spectrum of light, though it need not be. Examples of common combinations include a blue-emitting LED combined with a yellow-emitting wavelength converting material, a blue-emitting LED combined with green- and red-emitting wavelength converting materials, a UV-emitting LED combined with blue- and yellow-emitting wavelength converting material, and a UV-emitting LED combined with blue-, green-, and red-emitting wavelength converting materials. Wavelength converting materials emitting other colors of light may be added to tailor the spectrum of light emitted from the device. The wavelength converting material may be conventional phosphor particles, organic semiconductors, II-VI or III-V semiconductors, II-VI or III-V semiconductor quantum dots or nanocrystals, dyes, polymers, or materials such as GaN that luminesce. Phosphor particles may have an average diameter between 5 and 50 μm in some embodiments. Any suitable phosphor may be used, including but not limited to garnet-based phosphors such as $Y_3Al_5O_{12}$:Ce (YAG), $Lu_3Al_5O_{12}$:Ce (LuAG), $Y_3Al_{5-x}Ga_xO_{12}$:Ce (YAlGaG), $(Ba_{1-x}Sr_x)SiO_3$:Eu (BOSE), and nitride-based phosphors such as (Ca,Sr)AlSiN$_3$:Eu and $(Ca,Sr,Ba)_2Si_5N_8$:Eu.

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

What is being claimed is:

1. A method comprising:
   roughening a light extracting surface of a semiconductor structure, the semiconductor structure comprising a light emitting layer; and
   after the roughening, treating the surface to significantly reduce an amount of light extracted from the light extracting surface by increasing at least one of: total internal reflection within the semiconductor structure, and absorption at the surface.

2. The method of claim 1 wherein treating the surface comprises treating the surface with plasma.

3. The method of claim 2 wherein the plasma comprises at least one of Ar and O.

4. The method of claim 1 further comprising:
   growing the semiconductor structure on a growth substrate;
   attaching the semiconductor structure to a mount; and
   removing the growth substrate;
   wherein the light extracting surface is a surface revealed by removing the growth substrate.

5. The method of claim 1 wherein:
   the roughening of the surface comprises forming a plurality of peaks on the surface; and
   the treating of the surface comprises flattening tops of at least a portion of the plurality of peaks.

6. The method of claim 1 further comprising disposing a wavelength converting material over the treated surface.

7. A method comprising:
   roughening a light extracting surface of a semiconductor structure, the semiconductor structure comprising a light emitting layer; and
   after the roughening, treating the surface to significantly reduce an amount of light extracted from the semiconductor structure through the surface.

8. The method of claim 7 wherein treating the surface comprises treating the surface with plasma.

9. The method of claim 8 wherein the plasma comprises at least one of Ar and O.

10. The method of claim 7 further comprising:
    growing the semiconductor structure on a growth substrate;
    attaching the semiconductor structure to a mount; and
    removing the growth substrate;
    wherein the light extracting surface is a surface revealed by removing the growth substrate.

11. The method of claim 7 wherein:
    the roughening of the surface comprises forming a plurality of peaks on the surface; and
    the treating of the surface comprises flattening tops of at least a portion of the plurality of peaks.

12. A method comprising:
    growing a semiconductor structure on a growth substrate, the semiconductor structure comprising a light emitting layer disposed between an n-type region and a p-type region;
    removing the growth substrate;
    roughening a light extracting surface of the semiconductor structure; and
    treating the roughened surface with plasma, wherein the treating significantly reduces an amount of light extracted from the semiconductor structure through the roughened surface.

13. The method of claim 12 wherein treating the roughened surface with plasma comprises treating the surface to increase total internal reflection at the surface.

14. The method of claim 12 wherein treating the roughened surface with plasma comprises treating the surface to increase light absorption at the surface.

15. The method of claim 12 wherein:
    the roughening of the surface comprises forming a plurality of peaks on the surface; and the treating of the surface comprises flattening tops of at least a portion of the plurality of peaks.

16. The method of claim 12 further comprising disposing a wavelength converting material over the surface.

17. The method of claim 12, wherein the amount of light extracted is reduced by at least 10% by the treating of the surface.

18. The method of claim 7 further comprising disposing a wavelength converting material over the surface.

19. The method of claim 7, wherein the amount of light extracted is reduced by at least 10% by the treating of the surface.

* * * * *